(12) United States Patent
Mardian et al.

(10) Patent No.: US 7,229,666 B2
(45) Date of Patent: Jun. 12, 2007

(54) CHEMICAL VAPOR DEPOSITION METHOD

(75) Inventors: Allen P. Mardian, Boise, ID (US); Philip H. Campbell, Meridian, ID (US); Craig M. Carpenter, Boise, ID (US); Randy W. Mercil, Boise, ID (US); Sujit Sharan, Chandler, AZ (US)

(73) Assignee: Micron Technology, Inc., Boise, ID (US)

( * ) Notice: Subject to any disclaimer, the term of this patent is extended or adjusted under 35 U.S.C. 154(b) by 146 days.

(21) Appl. No.: 10/912,878

(22) Filed: Aug. 6, 2004

(65) Prior Publication Data
US 2005/0028732 A1 Feb. 10, 2005

Related U.S. Application Data

(62) Division of application No. 10/150,388, filed on May 17, 2002.

(51) Int. Cl.
C23C 16/00 (2006.01)

(52) U.S. Cl. .............. 427/248.1; 427/255.23; 117/84; 118/719

(58) Field of Classification Search .......... 427/248.1, 427/255.23; 117/84; 118/719
See application file for complete search history.

(56) References Cited

U.S. PATENT DOCUMENTS

| | | | | |
|---|---|---|---|---|
| 4,217,375 A | * | 8/1980 | Adams ................ | 438/784 |
| 4,392,915 A | | 7/1983 | Zajac | |
| 4,444,812 A | * | 4/1984 | Gutsche ............. | 427/255.17 |
| 4,513,021 A | * | 4/1985 | Purdes et al. ........ | 427/579 |
| 4,537,795 A | * | 8/1985 | Nath et al. .......... | 427/569 |
| 4,545,327 A | * | 10/1985 | Campbell et al. ...... | 118/719 |
| 4,633,809 A | | 1/1987 | Hirose et al. | |
| 4,640,221 A | | 2/1987 | Barbee et al. | |
| 4,716,852 A | | 1/1988 | Tsujii et al. | |
| 4,738,748 A | | 4/1988 | Kisa | |
| 4,910,043 A | * | 3/1990 | Freeman et al. ....... | 427/563 |
| 5,275,976 A | * | 1/1994 | Moslehi ............. | 438/800 |
| 5,304,279 A | | 4/1994 | Coultas et al. | |
| 5,338,363 A | | 8/1994 | Kawata et al. | |
| 5,356,120 A | * | 10/1994 | Konig et al. ......... | 266/175 |
| 5,366,585 A | * | 11/1994 | Robertson et al. ..... | 216/67 |
| 5,453,124 A | | 9/1995 | Moslehi et al. | |
| 5,468,298 A | | 11/1995 | Lei et al. | |
| 5,500,256 A | | 3/1996 | Watabe | |

(Continued)

FOREIGN PATENT DOCUMENTS

JP 02046723 A 2/1990

(Continued)

Primary Examiner—Bret Chen
(74) Attorney, Agent, or Firm—Wells St. John P.S.

(57) ABSTRACT

Methods of chemical vapor deposition include providing a deposition chamber defined at least in part by at least one of a chamber sidewall and a chamber base wall. At least one process chemical inlet to the deposition chamber is included. A substrate is positioned within the chamber and a process gas is provided over the substrate effective to deposit material onto the substrate. While providing the process gas, a purge gas is emitted into the chamber from a plurality of purge gas inlets comprised by at least one chamber wall surface. The purge gas inlets are separate from the at least one process chemical inlet and the emitting forms an inert gas curtain over the chamber wall surface.

19 Claims, 4 Drawing Sheets

U.S. PATENT DOCUMENTS

| | | | |
|---|---|---|---|
| 5,532,190 A | 7/1996 | Goodyear et al. | |
| 5,556,474 A | 9/1996 | Otani et al. | |
| 5,590,387 A * | 12/1996 | Schmidt et al. | 419/36 |
| 5,618,349 A * | 4/1997 | Yuuki | 118/715 |
| 5,647,912 A | 7/1997 | Kaminishizono et al. | |
| 5,674,574 A * | 10/1997 | Atwell et al. | 427/561 |
| 5,746,834 A | 5/1998 | Hanley | |
| 5,755,886 A | 5/1998 | Wang et al. | |
| 5,792,272 A | 8/1998 | van Os et al. | |
| 5,824,158 A | 10/1998 | Takeuchi et al. | |
| 5,827,370 A | 10/1998 | Gu | |
| 5,851,294 A | 12/1998 | Young et al. | |
| 5,884,009 A * | 3/1999 | Okase | 392/418 |
| 5,885,751 A | 3/1999 | Weidman et al. | |
| 5,972,430 A | 10/1999 | DiMeo, Jr. et al. | |
| 5,983,906 A | 11/1999 | Zhao et al. | |
| 6,050,506 A | 4/2000 | Guo et al. | |
| 6,059,885 A | 5/2000 | Ohashi et al. | |
| 6,085,690 A | 7/2000 | Mizuno | |
| 6,113,078 A | 9/2000 | Rock | |
| 6,114,227 A | 9/2000 | Leksell et al. | |
| 6,132,512 A | 10/2000 | Horie et al. | |
| 6,187,101 B1 * | 2/2001 | Yoshizawa | 118/718 |
| 6,197,119 B1 | 3/2001 | Dozoretz et al. | |
| 6,200,893 B1 | 3/2001 | Sneh | |
| 6,305,314 B1 | 10/2001 | Sneh et al. | |
| 6,312,526 B1 * | 11/2001 | Yamamuka et al. | 118/720 |
| 6,344,151 B1 * | 2/2002 | Chen et al. | 216/60 |
| 6,426,307 B2 | 7/2002 | Lim | |
| 6,444,039 B1 | 9/2002 | Nguyen | |
| 6,503,330 B1 | 1/2003 | Sneh et al. | |
| 6,579,372 B2 | 6/2003 | Park | |
| 6,638,880 B2 | 10/2003 | Yamamuka et al. | |
| 6,730,613 B1 | 5/2004 | Hwang et al. | |
| 6,890,596 B2 * | 5/2005 | Sarigiannis et al. | 427/248.1 |
| 2002/0157611 A1 | 10/2002 | Bondestam et al. | |
| 2004/0083959 A1 | 5/2004 | Carpenter et al. | |
| 2004/0216671 A1 | 11/2004 | Carpenter et al. | |

FOREIGN PATENT DOCUMENTS

| | | |
|---|---|---|
| JP | 2002-371361 | 12/2002 |

* cited by examiner

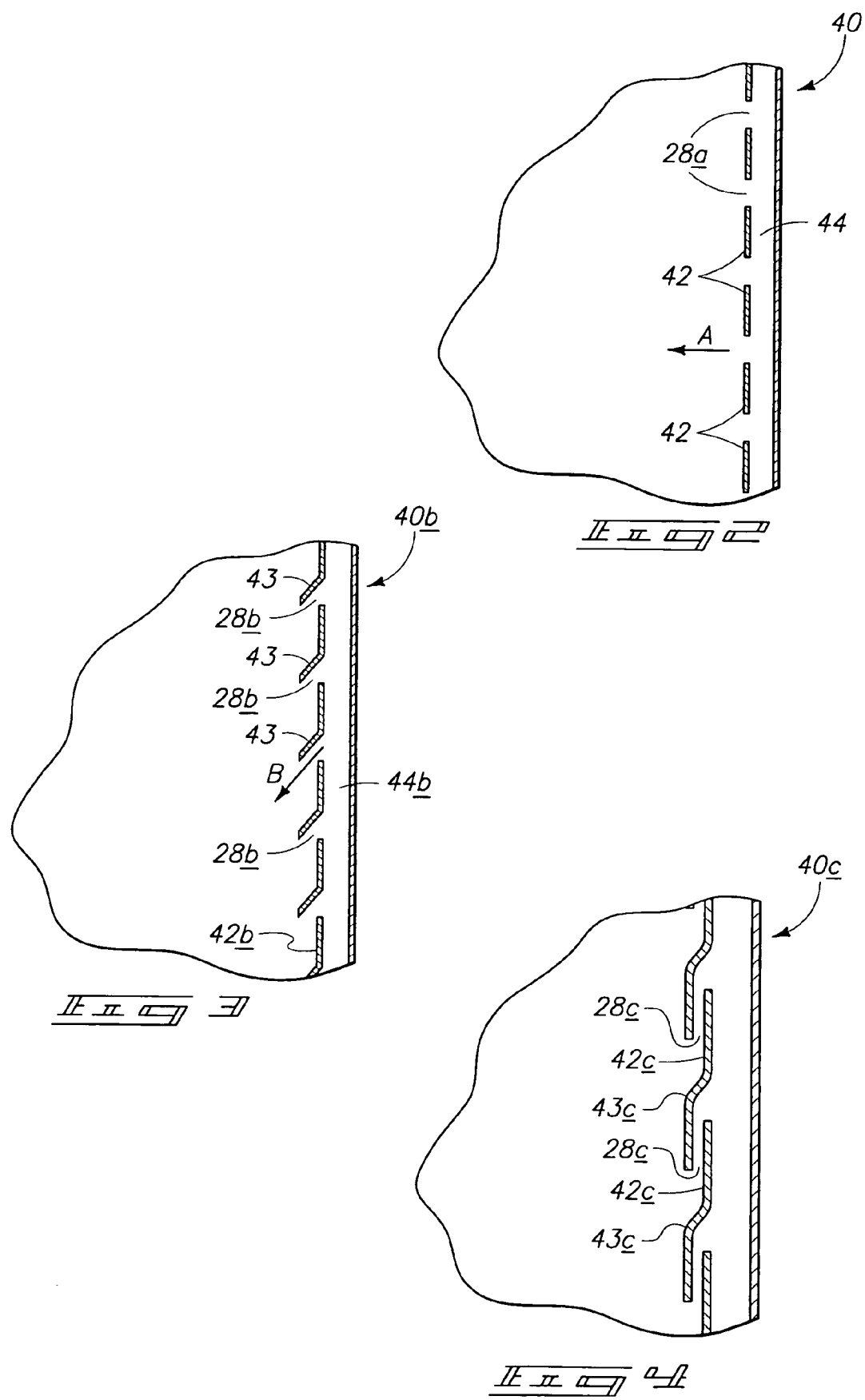

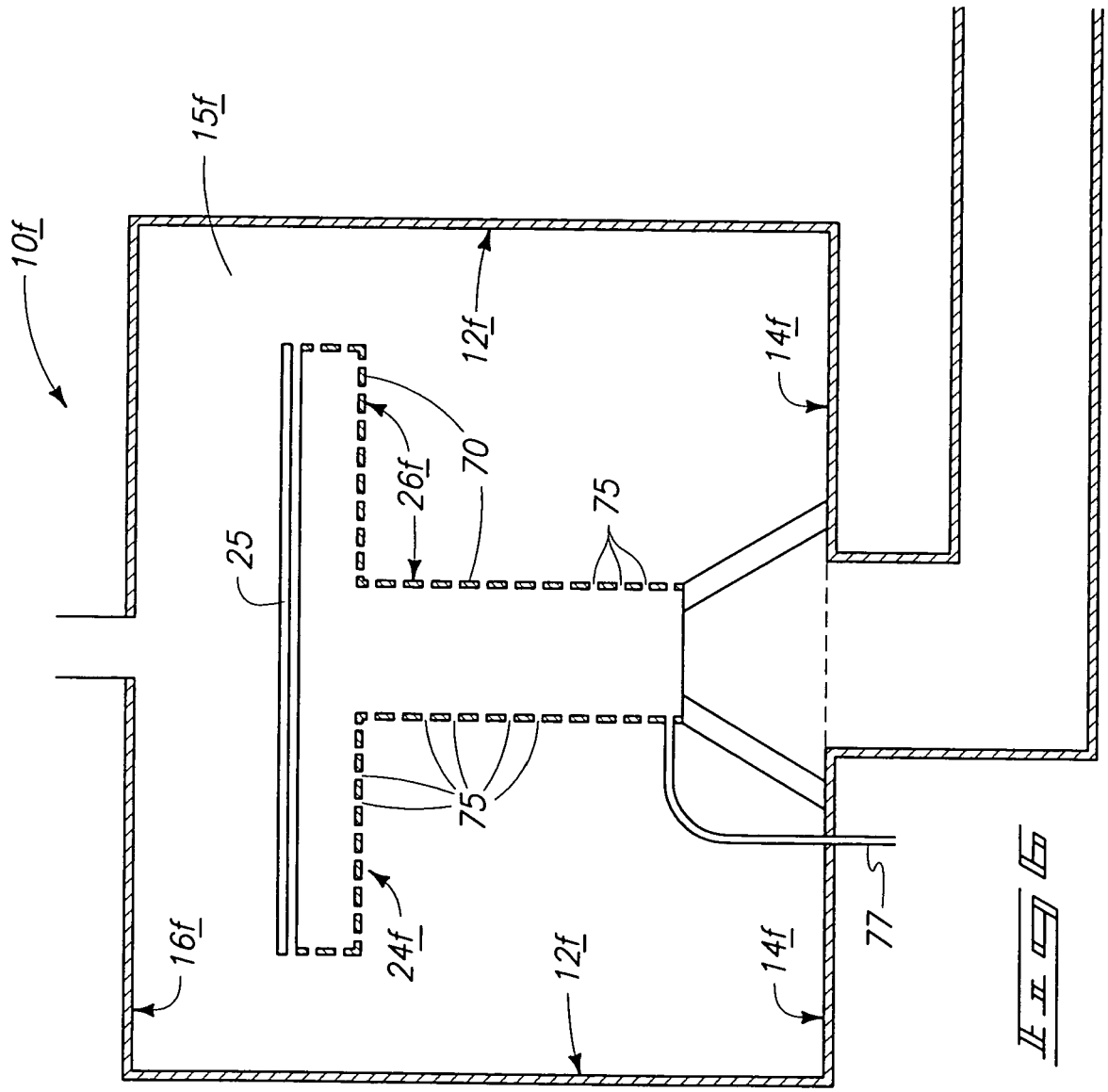

US 7,229,666 B2

CHEMICAL VAPOR DEPOSITION METHOD

RELATED PATENT DATA

This patent resulted from a divisional application of U.S. patent application Ser. No. 10/150,388, which was filed May 17, 2002.

TECHNICAL FIELD

This invention relates to deposition methods and to chemical vapor deposition apparatus.

BACKGROUND OF THE INVENTION

Semiconductor processing in the fabrication of integrated circuitry typically includes the deposition of layers on semiconductor substrates. Exemplary processes include physical vapor deposition (PVD), and chemical vapor deposition (CVD) including atomic layer deposition (ALD). With typical ALD, successive mono-atomic layers are adsorbed to a substrate and/or reacted with the outer layer on the substrate, typically by successive feeding of different precursors to the substrate surface.

Chemical and physical vapor depositions can be conducted within chambers or reactors which retain a single substrate upon a wafer holder or susceptor. The chambers include internal walls which can undesirably have deposition product deposited thereupon in addition to the substrate. This is particularly problematic in ALD and other CVD processes, yet can also occur with PVD chambers. One existing method of protecting or preserving the internal chamber walls is to shield such from the deposition material with one or more removable liners. These liners might be received immediately adjacent or against the internal chamber walls. Alternately, the liners might be displaced therefrom, thereby defining an appreciably reduced volume chamber, or subchamber, within which the substrate is received for deposition. One advantage of using liners is that they can be periodically replaced with new or cleaned liners, thereby extending the life of the deposition chambers. Further and regardless, the spent liners can typically be removed and replaced much more quickly than the time it would take to clean the internal chamber walls at a given cleaning interval.

The invention was motivated in overcoming the above-described drawbacks, although it is in no way so limited. The invention is only limited by the accompanying claims as literally worded without interpretative or other limiting reference to the specification or drawings, and in accordance with the doctrine of equivalents.

SUMMARY

The invention includes deposition methods and chemical vapor deposition apparatus. In one implementation, a chemical vapor deposition apparatus includes a deposition chamber defined at least in part by at least one of a chamber sidewall and a chamber base wall. A substrate holder is received within the chamber. At least one process chemical inlet to the deposition chamber is included. At least one of the chamber sidewall and chamber base wall includes a chamber surface having a plurality of purge gas inlets to the chamber therein. The purge gas inlets are separate from the at least one process chemical inlet. A purge gas inlet passageway is provided in fluid communication with the purge gas inlets. In one implementation, a chemical vapor deposition apparatus includes a chamber defined at least in part by chamber walls. A chamber liner apparatus is included which forms a deposition subchamber within the chamber. A substrate holder is provided within the deposition subchamber. The chamber liner apparatus includes a subchamber surface having a plurality of purge gas inlets to the chamber therein. A purge gas inlet passageway is in fluid communication with the purge gas inlets.

In one implementation, a deposition method includes positioning a substrate within a deposition chamber defined at least in part by chamber walls. At least one of the chamber walls includes a chamber surface having a plurality of purge gas inlets to the chamber therein. A process gas is provided over the substrate effective to deposit material onto the substrate. During the providing, purge gas is emitted to the deposition chamber from the purge gas inlets effective to form an inert gas curtain over the chamber surface. In one implementation, a deposition method includes positioning a substrate within a deposition chamber defined at least in part by chamber walls. The deposition chamber has a component received therein internally of the chamber walls. The component has a surface exposed to the chamber. The surface has a plurality of purge gas inlets to the chamber therein. A process gas is provided over the substrate effective to deposit material onto the substrate. During the providing, purge gas is emitted to the deposition chamber from the purge gas inlets effective to form an inert gas curtain over the component surface within the deposition chamber.

Further implementations are contemplated.

BRIEF DESCRIPTION OF THE DRAWINGS

Preferred embodiments of the invention are described below with reference to the following accompanying drawings.

FIG. 2 is an enlarged sectional view of a portion of a chemical vapor deposition apparatus in accordance with an aspect of the invention FIG. 3 is an enlarged sectional view of a portion of an alternate embodiment chemical vapor deposition apparatus in accordance with an aspect of the invention.

FIG. 4 is an enlarged sectional view of a portion of another alternate embodiment chemical vapor deposition apparatus in accordance with an aspect of the invention.

FIG. 6 is a diagrammatic sectional view of another alternate chemical vapor deposition apparatus in accordance with an aspect of the invention.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
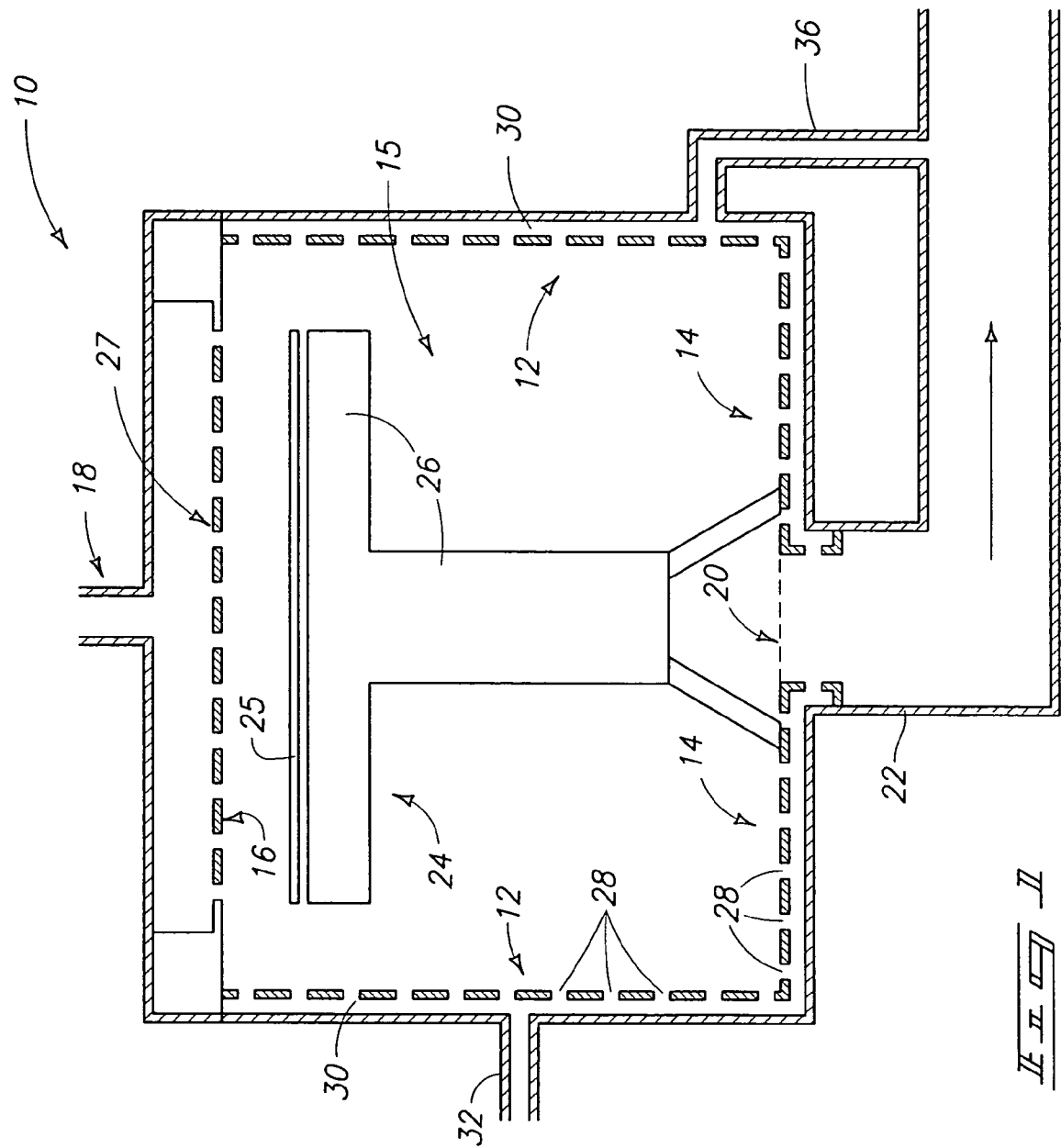
FIG. 1 is a diagrammatic sectional view of a chemical vapor deposition apparatus in accordance with an aspect of the invention.

Referring to FIG. 1, an exemplary embodiment chemical vapor deposition apparatus in accordance with an aspect of the invention is indicated generally with reference numeral 10. Such includes a chamber 15 defined at least in part by chamber walls 12, 14 and 16. Wall or walls 12 comprise a chamber sidewall, wall or walls 14 comprise a chamber base wall, and wall or walls 16 comprise a chamber top wall. Chamber 15 includes at least one process chemical inlet 18 thereto, and an outlet 20 feeding therefrom. Outlet 20 feeds to a foreline 22 for connection with a vacuum pump (not shown). A suitable substrate holder 24 is provided within chamber 15. Such includes some suitable support structure 26, and is illustrated as receiving a substrate 25, preferably a semiconductor substrate, thereatop. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. Process gas inlet 18 is diagrammatically shown as feeding to a showerhead 27 associated with a lid of the apparatus for providing one or more process gasses to substrate 25 for deposition of a material thereon.

Chamber sidewalls 12 and chamber base walls 14 are depicted as having chamber surfaces having a plurality of purge gas inlets 28 to the chamber formed therein. The depicted purge gas inlets are separate or different from process gas inlet 18. Further in the depicted preferred embodiment, a plenum chamber 30 is formed behind walls 12, 14 and is fed by a purge gas inlet passageway 32, which is thereby in fluid communication with purge gas inlets 28. In preferred implementations, walls 12, 14 are constructed of highly porous materials, such as sintered metal particles or fibers, low density teflon, or other synthetic organic and/or inorganic materials, and by way of example only. Material selection would ideally be based on intended process chemistries. Further by way of example only, walls 12, 14 might be constructed to form a screen-like mesh, with pores/outlets 28 being defined by interstices thereof. The pore sizes of the material would depend on material characteristics and deposition process characteristics. Exemplary pore sizes include from tens of microns to tens of Angstroms. Further by way of example only, walls 12, 14 might comprise an essentially solid, hard, planar wall surface having a plurality of openings 28 drilled or otherwise formed therein, such as is shown. In the FIG. 1 depicted preferred embodiment, the chamber surface having the plurality of purge gas inlets 28 is essentially formed on and constitutes both the chamber sidewall and the chamber base wall. Further by way of example only, such purge gas inlets might alternately be included only on either the sidewall or base wall, and also contemplates the chamber surface as being only a portion or portions thereof. Further, purge gas inlets might also be provided on a top wall of chamber 15, for example in manners described herein, and in accordance with U.S. patent application Ser. No. 09/805,620 filed on Mar. 13, 2001, entitled "Chemical Vapor Deposition Apparatus and Deposition Methods", listing Craig M. Carpenter and Ross S. Dando as inventors, and which is hereby incorporated by reference.

In one implementation, and as depicted, the purge gas inlets are substantially uniformly distributed over the chamber surface over which such are received. Further and/or additionally, purge gas inlets 28 might all be of substantially constant size, or of at least two inlet sizes. In one preferred embodiment, at least some of purge gas inlets 28 which are further from chamber outlet 20 are larger than at least some of the purge gas inlets 28 which are closer to chamber outlet 20. Such provides one manner by which, if desired, a greater volumetric flow of purge gas can be provided proximate the respective wall surfaces further from chamber outlet 20 than closer thereto. A purge gas outlet passageway 36 is depicted as extending from purge gas inlet passageway 32, 30 to foreline 22, thereby by-passing the plurality of purge gas inlets 28. Appropriate valving (not depicted) might, of course, be associated with passageway 36 or any other of the depicted passageways/inlets/outlets. A purge gas outlet passageway might be included to assist in control of the flow rate and pressure within plenum chamber 30 and, thereby, also from purge gas inlets 28.

By way of example only, FIGS. 2, 3 and 4 depict exemplary alternate embodiments of purge gas inlets 28. For example, FIG. 2 depicts an exemplary chamber wall 40 having a chamber surface 42 having a plurality of purge gas inlets 28a received therein. Such are depicted as comprising openings extending from a purge gas inlet passageway 44 within wall 40 and which would be exposed to a deposition chamber, for example deposition chamber 15. Accordingly, the exemplary depicted purge gas inlets 28a in such embodiment (and inlets 28 in the FIG. 1 embodiment) are configured for discharging purge gas to the chamber in a direction which is substantially transverse, for example in a direction "A" to chamber surface 42. In the context of this document, "a direction substantially transverse" is defined to mean anything from perfectly perpendicular (90°) to the chamber surface to, but not including, 45° from the chamber surface.

FIG. 3 depicts an exemplary alternate embodiment chamber wall 40b. Like numerals from the FIG. 2 described embodiment are utilized where appropriate, with differences being indicated by the suffix "b" or with different numerals. Purge gas inlets 28b are depicted as being configured for discharging purge gas to the chamber in a direction substantially along chamber surface 42b. In the context of this document, "substantially along" means from 45° to parallel with the chamber surface. In the depicted exemplary FIG. 3 embodiment, chamber surface 42b is provided (or alternately considered, purge inlets 28b are provided) with deflectors/diverters/ramps 43 angled at an exemplary 40° from surface 42b for achieving such purge gas discharging generally in a direction "B".

Further by way of example only, FIG. 4 depicts yet another embodiment configuration for purge gas inlets 28c. Like numerals from the FIGS. 2 and 3 described embodiments are utilized where appropriate, with differences being indicated with the suffix "c", or with different numerals. In FIG. 4, deflectors 43c are depicted as curving or ramping to extend a portion thereof essentially parallel along surface 42c.

The invention also contemplates deposition methods utilizing the above-described equipment, and utilizing other equipment. In other words, the apparatus aspects of the invention are independent of the methodical aspects, and the methodical aspects are independent of the apparatus aspects, except with respect to literal claim-recited language, and without limiting or other interpretive reference to the specification and drawings. In accordance with an aspect of the invention, one preferred deposition method positions a substrate within a deposition chamber defined, at least in part, by chamber walls such as, by way of example only, substrate 25 positioned within chemical vapor deposition apparatus 10. At least one of the chamber walls comprises a chamber surface having a plurality of purge gas inlets to the chamber. For example, any multiple set or subset of purge gas inlets 28, in conjunction with the FIG. 1 described embodiment, depict such a plurality of purge gas inlets.

A process gas is provided over the substrate effective to deposit material onto the substrate. In the depicted exemplary FIG. 1 embodiment, one or more process gasses could be provided via process gas inlet 18 to showerhead 27. During the providing of such a process gas effective to deposit material onto the substrate, purge gas is emitted to the deposition chamber from purge gas inlets effective to form an inert gas curtain over the chamber surface having such plurality of purge gas inlets. Exemplary inert purge gases include noble gases and N2. A preferred and desired, although non-limiting, goal of such emitting is to restrict or perhaps completely prevent deposition product or effluent product from depositing upon the chamber surface or surfaces having such purge gas inlets associated therewith. In accordance with preferred methodical aspects of the invention in forming an inert gas curtain, total inert purge gas flow from all inlets is ideally rather low, for example from 100 to 200 sccm in a six liter reactor, so as to not adversely load or undesirably affect the sizing requirements of the vacuum pumping equipment.

In one preferred methodical aspect of the invention, the purge gas is emitted to the chamber in a direction substantially transverse to the chamber surface associated with the purge gas inlets and, in one embodiment, is also effective to form the inert gas curtain to comprise substantially turbulent gas flow proximate the chamber surface. In another preferred embodiment, the purge gas emitting to the chamber is in a direction substantially along the chamber surface and, in one embodiment, is additionally effective to form the inert gas curtain to comprise substantially laminar gas flow proximate the chamber surface. In some operating regimes, viscous or turbulent flow may be desired proximate the surface being protected, whereas in other regimes laminar flow might be desired.

In one embodiment, the purge gas emitting comprises emitting a greater volume of purge gas from at least some purge gas inlets located further from the chamber outlet than from at least some purge gas inlets located closer to the chamber outlet. Such might be accommodated by providing larger outlets further from the chamber outlet than closer to the chamber outlet, and/or by providing greater flow and/or pressure to the purge gas inlets which are located further/furthest from the chamber outlet. In accordance with methodical aspects of the invention, preferred depositions include chemical vapor deposition, including atomic layer deposition.

Figure 5:
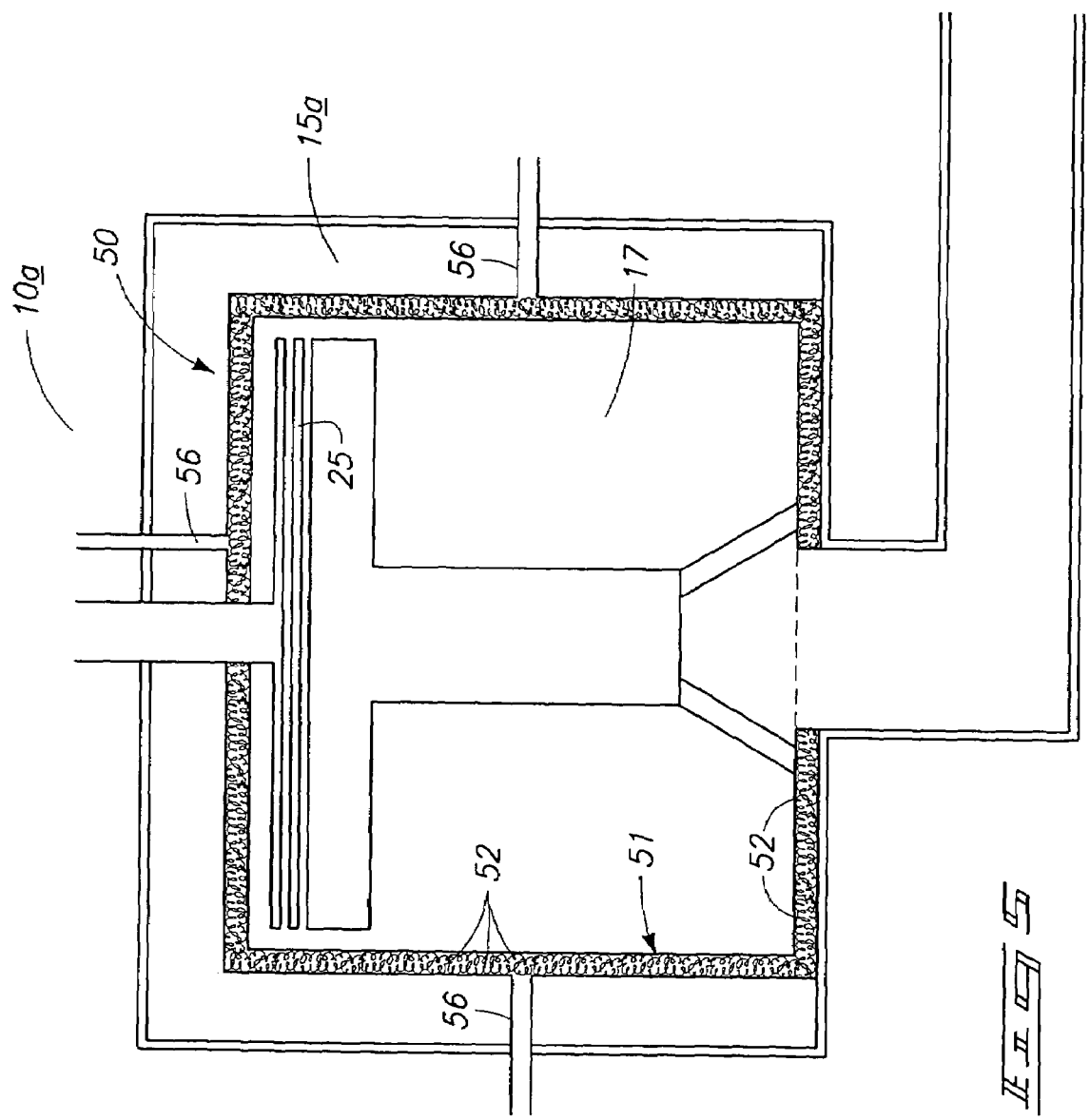
FIG. 5 is a diagrammatic sectional view of an alternate chemical vapor deposition apparatus in accordance with an aspect of the invention.

The above-described exemplary embodiments/implementations were essentially in conjunction with chamber walls which effectively define a maximum internal volume within a deposition apparatus 10. FIG. 5 depicts an exemplary alternate chemical vapor deposition apparatus 10a. Like numerals from the FIG. 1 described embodiment are utilized where appropriate, with differences being indicated with the suffix "a", or with different numerals. Chemical vapor deposition apparatus 10a includes a chamber liner apparatus 50 forming a deposition subchamber 17 within chamber 15a. Chamber liner apparatus 50 comprises subchamber surfaces 51 having a plurality of purge gas inlets 52 to the subchamber therein. By way of example only, purge gas inlets 52 might be configured in any of the manners described above, including the depictions with respect to inlets 28, 28a, 28b and 28c described above. Further, liner apparatus 50 would ideally be configured or fabricated to be an easily replaceable component of apparatus 10a. By way of example only, the exemplary FIG. 5 embodiment depicts the various walls of liner apparatus 50 as comprising a retained intertwined, mesh-like material which is fed by a plurality of purge gas inlet passageways 56 for providing the desired purge gas thereto during deposition. Other preferred attributes of the FIGS. 1–4 depicted apparatus, and all methods, as described above can be incorporated with chamber liner apparatus 50.

In accordance with some aspects and implementations of the invention, alternate exemplary embodiments are described with reference to FIG. 6. Like numerals from the first-described embodiments are utilized where appropriate, with differences being indicated with the suffix "f", or with different numerals. FIG. 6 depicts a chemical vapor deposition apparatus 10f comprising a deposition chamber 15f which is at least in part defined by chamber walls 12f, 14f and 16f. Substrate holder 24f comprises support structure 26f. Such includes a surface or surfaces 70 exposed to chamber 15f and which comprise(s) a plurality of purge gas inlets 75 to chamber 15f. An exemplary purge gas inlet passageway 77 is shown in communication with support structure 26f, and accordingly with purge gas inlets 75. Such purge gas inlets might have any of the attributes described above with respect to the other described embodiments. The FIG. 6 10f depicted apparatus might be utilized in conjunction with purge gas to preclude, or at least reduce, the undesired deposition of material onto the depicted surface or surfaces of the substrate holder support structure.

Regardless, and in accordance with another methodical implementation of the invention, a deposition method comprises positioning a substrate within a deposition chamber defined at least in part by chamber walls. The deposition chamber comprises a component received therein internally of the chamber walls. By way of example only, substrate holder 24f and its associated support structure 26f is one exemplary such component. However, any other component is contemplated in accordance with this methodical aspect of the invention. The component comprises a surface, exposed to the chamber, which has a plurality of purge gas inlets to the chamber therein. A process gas is provided over the substrate effective to deposit material onto the substrate. During providing of the process gas, purge gas is emitted to the deposition chamber from the purge gas inlets effective to form an inert gas curtain over the component surface within the deposition chamber. A preferred effect is to prevent, or at least reduce, undesired material from depositing onto such component surface. Any other attribute, as described above with respect to other methodical aspects of the invention, is of course contemplated.

Control of the purge gas flow can be through a variety of methods, such as an active feedback control loop based on a pressure sensors ported to the purge gas channels and linked to mass flow controllers, needle valves, EMCO digital valve-type flow control, line pressure regulators or other existing or yet-to-be developed methods.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A deposition method comprising:
    positioning a substrate within a deposition chamber defined at least in part by a chamber wall comprising a wall material and a chamber surface having a plurality of purge gas inlets to the chamber therein, the purge gas inlets comprising pores or interstices of the wall material;

providing a process gas over the substrate effective to deposit material onto the substrate; and while providing the process gas over the substrate, emitting purge gas to the deposition chamber from the purge gas inlets effective to form an inert gas curtain over the chamber surface.

2. The method of claim 1 comprising emitting the purge gas to the chamber in a direction substantially transverse to the chamber surface and effective to form the inert gas curtain to comprise substantially turbulent gas flow proximate the chamber surface.

3. The method of claim 1 comprising emitting the purge gas to the chamber in a direction substantially along the chamber surface and effective to form the inert gas curtain to comprise substantially laminar gas flow proximate the chamber surface.

4. The method of claim 1 wherein the chamber wall having the plurality of purge gas inlets is a sidewall.

5. The method of claim 1 wherein the chamber wall having the plurality of purge gas inlets is a base wall.

6. The method of claim 1 wherein the deposition chamber comprises a sidewall and a base wall, the plurality of purge gas inlets being received on both the sidewall and the base wall.

7. The method of claim 1 wherein the deposition chamber includes an outlet therefrom, the emitting comprises emitting a greater volume of purge gas from at least some purge gas inlets located further from the chamber outlet than at least some purge gas inlets located closer to the chamber outlet.

8. The method of claim 1 wherein the chamber includes a chamber outlet therefrom, at least some of the purge gas inlets further from the chamber outlet being larger than at least some of the purge gas inlets closer to the chamber outlet, the emitting comprising emitting a greater volume of purge gas from the at least some purge gas inlets located further from the chamber outlet than from the at least some purge gas inlets located closer to the chamber outlet.

9. The method of claim 1 wherein the chamber wall having the chamber surface comprises a surface of a chamber liner apparatus forming a deposition subchamber within the chamber.

10. The method of claim 1 comprising chemical vapor deposition.

11. The method of claim 1 comprising atomic layer deposition.

12. A deposition method comprising:

positioning a substrate within a deposition chamber defined at least in part by chamber walls, the deposition chamber comprising a component received therein internally of the chamber walls, the component comprising a material having a surface exposed to the chamber, the surface comprising a plurality of purge gas inlets to the chamber therein, the purge gas inlets comprising pores or interstices of the material;

providing a process gas over the substrate effective to deposit material onto the substrate; and during the providing, emitting purge gas to the deposition chamber from the purge gas inlets effective to form an inert gas curtain over the component surface within the deposition chamber.

13. The method of claim 12 wherein the component comprises a portion of a substrate support received internally of the chamber walls.

14. The method of claim 12 comprising emitting the purge gas to the chamber in a direction substantially transverse to the surface and effective to form the inert gas curtain to comprise substantially turbulent gas flow proximate the surface.

15. The method of claim 12 comprising emitting the purge gas to the chamber in a direction substantially along the surface and effective to form the inert gas curtain to comprise substantially laminar gas flow proximate the surface.

16. The method of claim 12 wherein the deposition chamber includes an outlet therefrom, the emitting comprises emitting a greater volume of purge gas from at least some purge gas inlets located further from the chamber outlet than at least some purge gas inlets located closer to the chamber outlet.

17. The method of claim 12 wherein the chamber includes a chamber outlet therefrom, at least some of the purge gas inlets further from the chamber outlet being larger than at least some of the purge gas inlets closer to the chamber outlet, the emitting comprising emitting a greater volume of purge gas from the at least some purge gas inlets located further from the chamber outlet than from the at least some purge gas inlets located closer to the chamber outlet.

18. The method of claim 12 comprising chemical vapor deposition.

19. The method of claim 12 comprising atomic layer deposition.

* * * * *